United States Patent
Yu et al.

(10) Patent No.: US 7,847,591 B2
(45) Date of Patent: Dec. 7, 2010

(54) LOW JITTER CMOS TO CML CONVERTER

(75) Inventors: Qianyu Yu, Shanghai (CN); Josh Chiachi Yang, Shanghai (CN); Hao Liu, Shanghai (CN)

(73) Assignee: Semiconductor Manufacturing (Shanghai) Corporation, Shanghai (CN)

( * ) Notice: Subject to any disclaimer, the term of this patent is extended or adjusted under 35 U.S.C. 154(b) by 0 days.

(21) Appl. No.: 12/391,100

(22) Filed: Feb. 23, 2009

(65) Prior Publication Data

US 2009/0212823 A1 Aug. 27, 2009

(30) Foreign Application Priority Data

Feb. 22, 2008 (CN) .......................... 2008 1 0033814

(51) Int. Cl.
*H03K 19/0175* (2006.01)
*H03K 19/094* (2006.01)

(52) U.S. Cl. ......................................... 326/68; 326/115

(58) Field of Classification Search ................... 326/27, 326/68, 112, 115, 119; 327/109, 359
See application file for complete search history.

(56) References Cited

U.S. PATENT DOCUMENTS 6,794,907 B2 * 9/2004 Choi ........................... 326/127

\* cited by examiner

*Primary Examiner*—Daniel D Chang
(74) *Attorney, Agent, or Firm*—Squire, Sanders & Dempsey, L.L.P.

(57) ABSTRACT

The present invention provides a low jitter CMOS to CML converter, including: a differential circuit including differential pair transistors, a pair of loads and a biased transistor, each differential transistor of the differential pair transistors having an input terminal, an output terminal and a connection terminal. With the current compensation device, an additional current path may be provided for the current of the biased transistor which is used as a constant current source when the differential transistors are turned off, so that the peak tail current in the biased transistor current may be eliminated. Thus, the problem caused by the tail current that the common mode output voltages of the converter is unstable and has a high jitter may be solved.

11 Claims, 6 Drawing Sheets

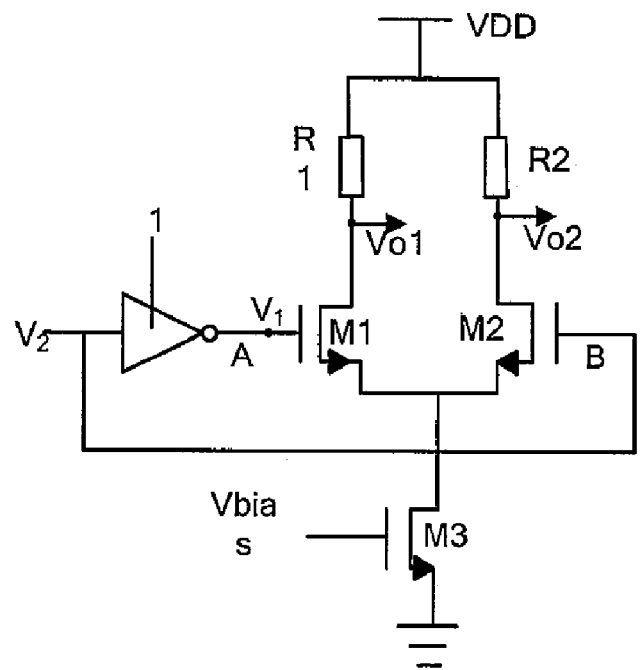
Fig.1 *(Prior Art)*
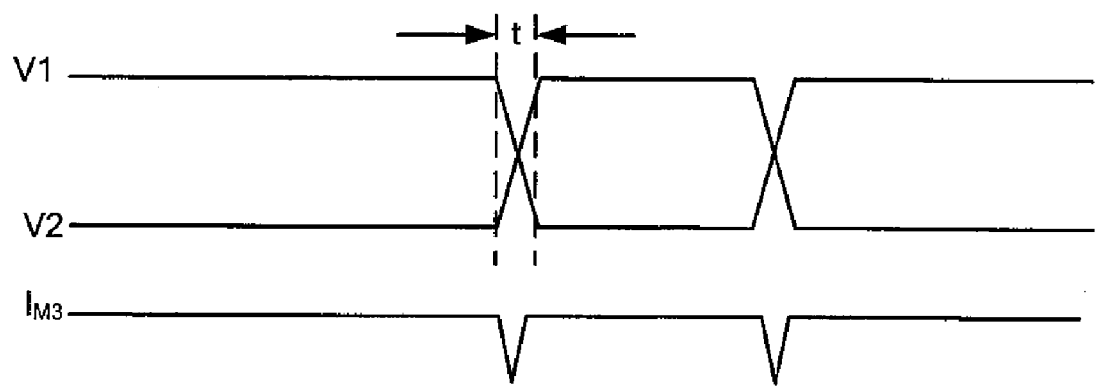
Fig.2 *(Prior Art)*

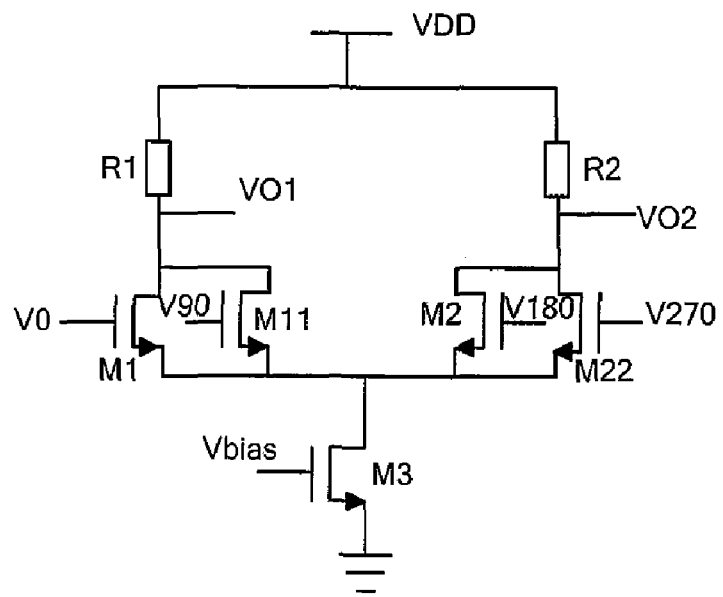
Fig.3 *(Prior Art)*
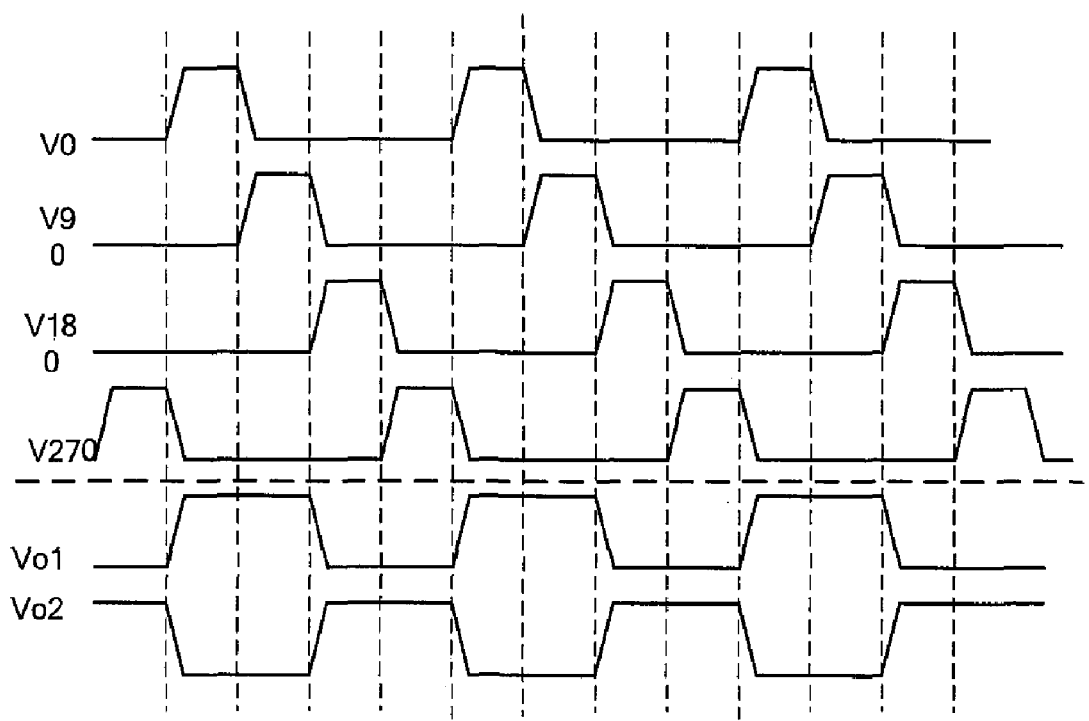
Fig.4 *(Prior Art)*

LOW JITTER CMOS TO CML CONVERTER

This application claims the priority of Chinese Patent Application No. 200810033814.X, filed Feb. 22, 2008, the entire disclosure of which is incorporated herein by reference.

FIELD OF THE INVENTION

The present invention relates to the technical field of a converter between different circuits of an integrated circuit (IC), and in particular, to a CMOS to Current-Mode Logic (CML) converter.

BACKGROUND OF THE INVENTION

In a high speed data transmission system, the integration level of circuit modules becomes increasingly higher, and the size becomes smaller and smaller. Therefore, when designing an IC module, the designer needs to comprehensively consider influences of different aspects of the IC such as operation speed, power consumption and noise. The CMOS circuit has an advantage of low power consumption. However, the operation speed of the CMOS circuit is relatively low, and a relatively high noise tends to be produced. In contrast, the CML circuit has a high operation speed which is ten times higher than that of the CMOS circuit, and a low noise, but the power consumption of the CML circuit is relatively high. In a current design of a high speed System on Chip (SOC), the CMOS circuit and CML circuit are used in combination to compensate the disadvantage of each other. Since the CMOS circuit is a single-port input-output circuit with a rail-to-rail amplitude level, whereas the CML circuit is a dual port input-output circuit with low voltage differential signal, a converter needs to be employed between the CMOS circuit and the CML circuit, so as to implement the transition between the CMOS circuit and the CML circuit.

A differential circuit is a converter that is often employed from CMOS to CML. The differential circuit includes differential pair transistors, a pair of loads, and a biased transistor. Each transistor of the differential pair transistors has three terminals, i.e., an input terminal, a connection terminal and an output terminal. As shown in FIG. 1, a CMOS to CML converter is illustrated as an example, where differential pair transistors include a pair of transistors, and each transistor is an NMOS transistor. The circuit includes a pair of differential NMOS transistors M1 and M2 and a pair of loads i.e. resistor R1 and resistor R2. Generally, the resistance value of resistor R1 is equal to that of resistor R2. The current sink of the circuit is NMOS transistor M3, whose gate is connected to an external bias voltage Vbias. An output signal $V_2$ of CMOS and a signal $V_1$ that is obtained when V2 passes through an inverter 1 constitute a pair of differential signals. The pair of differential signals is used as the input signals B and A for the differential pair transistors M2 and M1. Referring to FIG. 2, in the traditional converter as shown in FIG. 1, when the input signals of the differential pair transistors M1 and M2 are in the transition phase t, the differential pair transistors M1 and M2 tends to be turned off simultaneously, so that the current $I_{M3}$ in the biased transistor M3 that acts as a constant current source may be changed abruptly, and a peak tail current may be caused. The existence of the peak tail current may further affect the stability of the common mode voltage signals that are output from the signal output terminals Vo1 and Vo2 of the whole converter, so that the jitter of the converter is high.

The U.S. Pat. No. 7,038,495 discloses a low jitter high speed CMOS to CML clock converter, whose circuit is as shown in FIG. 3. This converter is an improvement of the traditional converter. The differential pair transistors in the converter include two pairs of differential transistors: M1 and M2, M11 and M22. Taking it as an example that the differential transistors are all NMOS transistors, the differential transistors in the converter include four differential NMOS transistors: M1, M11, M2 and M22. These four differential transistors are divided into two groups, and each group includes two differential transistors: M1 and M11, M2 and M22. In each group of the differential transistors M1 and M11 or M2 and M22, the source terminal of M1/M2, which is used as the connection terminal of the differential transistor, is connected with the source terminal of M11/M22, which is used as the connection terminal of the differential transistor, and the drain terminal of M1/M2, which is used as the output terminal of the differential transistor, is connected with the drain terminal of M11/M22, which is used as the output terminal of the differential transistor. A voltage with a phase of 0 degree is input to M1, a voltage with a phase of 90 degree is input to M11, a voltage with a phase of 180 degree is input to M2, and a voltage with a phase of 270 degree is input to M22. The input signals of M1 and M2 are a pair of differential signals with respect to each other, and the input signals of M11 and M22 are a pair of differential signals with respect to each other. The input voltage signals are as shown in FIG. 4. Within a change period of the output signal Vo1/Vo2, M1, M11, M2 and M22 are turned on in sequence. There are a plurality of transitions, i.e. the transition between M1 and M11, between M11 and M2, between M2 and M22 as well as between M22 and M1. The existence of the transitions between a plurality of input signals causes the peak tail current in the current $I_{M3}$ of the biased transistor M3 to appear even more frequently within a change period of the output signal. Meanwhile, the common mode voltage signal output from the output terminal Vo1/Vo2 of the converter is unstable, and thus a high jitter is caused.

SUMMARY OF THE INVENTION

An object of the present invention is to provide a low jitter CMOS to CML converter, so as to solve the problem in the existing CMOS to CML converters i.e. to solve the problem that the peak tail current makes the common mode voltage signals output from the two output terminals of the converter unstable and the converter has a high jitter.

In order to solve the above problem, the present invention provides a low jitter CMOS to CML converter. The converter includes a differential circuit including differential pair transistors, a pair of loads and a biased transistor. Each transistor of the differential pair transistors has three terminals, i.e., an input terminal, an output terminal and a connection terminal. Further, the low jitter converter includes a plurality of current compensation devices. Each differential transistor has a current compensation device, and the two terminals of the current compensation device are connected with the output terminal and the input terminal of the differential transistor respectively.

When the differential pair transistors include a pair of differential transistors, the input signals of the input terminals of the two differential transistors construct a pair of differential input signals with respect to each other. When the pair of differential transistors includes NMOS transistors, the input terminal of the differential transistor is the gate of the NMOS transistor, the output terminal of the differential transistor is the drain of the NMOS transistor, and the connection terminal of the differential transistor is the source of the NMOS transistor. Correspondingly, the current compensation device may includes two PMOS transistors, one PMOS transistor is connected with the NMOS transistor correspondingly, i.e., the source of the PMOS transistor is connected with the drain of the NMOS transistor, and the drain of the PMOS transistor is connected with the source of the NMOS transistor. The PMOS transistor further includes a control gate. The gate of the NMOS transistor that is connected with the PMOS transistor is input with one of the pair of the differential input signals, and the other differential input signal of the pair of the differential input signals is connected with the control gate of the PMOS transistor. The current compensation device may include two current compensation resistors. A current compensation resistor is connected with a differential NMOS transistor, where one current compensation resistor is connected with the drain of the NMOS transistor, and the other terminal of the current compensation resistor is connected with the source of the NMOS transistor.

When the differential pair transistors include two pairs of differential transistors, the two pairs of differential transistors are divided into two groups and each group includes two differential transistors. The connection terminals of the two differential transistors in each group are connected with each other, and the output terminals of the two differential transistors are connected with each other. The input signal of a differential transistor in a group and the input signal of a differential transistor in the other group are differential signals with respect to each other. When the two pairs of differential transistors are all NMOS transistors, the input terminal of the differential transistor is the gate of the NMOS transistor, the output terminal of the differential transistor is the drain of the NMOS transistor, and the connection terminal of the differential transistor is the source of the NMOS transistor. Correspondingly, the current compensation device includes two pairs of PMOS transistors, one PMOS transistor is connected with a differential NMOS transistor correspondingly, i.e., the source of the PMOS transistor is connected with the drain of the NMOS transistor, and the drain of the PMOS transistor is connected with the source of the NMOS transistor. Furthermore, the PMOS transistor includes a control gate, the input signal of the gate of the NMOS transistor corresponding to the PMOS transistor is one of the pair of differential input signals of the low jitter converter. The other input signal, with which the input signal of the gate of the NMOS transistor constitutes a pair of differential input signals, is connected to the control gate of the PMOS transistor. The current compensation device includes two current compensation resistors. One current compensation resistor is connected with a group of differential NMOS transistor, i.e., one terminal of the current compensation resistor is connected with drains of two NMOS transistors in the corresponding group and the other terminal is connected with sources of the two NMOS transistors of the corresponding group.

Compared with the traditional CMOS to CML converter and the improved CMOS to CML converter in the prior art, according to the present invention, a current compensation device is added to the differential transistor. If both differential transistors are turned off when two input signals of the differential transistors are in the transition region, an additional current path is provided for the current of the biased transistor by the current compensation device, so that the peak tail current in current sink transistor may be eliminated when the differential transistors are both turned off. Thus, the problem caused by the tail current i.e. the common mode output voltage signal from the output terminal of the converter is unstable and the converter has a high jitter, may be effectively solved.

BRIEF DESCRIPTION OF THE DRAWINGS

Hereinafter, the low jitter CMOS to CML converter according to the present invention will be further illustrated in detail in conjunction with the drawings and the embodiments.

FIG. 1 is a schematic showing a traditional CMOS to CML converter;

FIG. 2 is a waveform showing the variation of input signals of two differential transistors and the variation of a current of a biased transistor as shown in FIG. 1;

FIG. 3 is a schematic showing an improved CMOS to CML converter;

FIG. 4 is a waveform showing the variation of an input signal and an output signal of the converter as well as the variation of a current of a biased transistor as shown in FIG. 3;

DETAILED DESCRIPTION OF THE EMBODIMENTS

Figure 5:
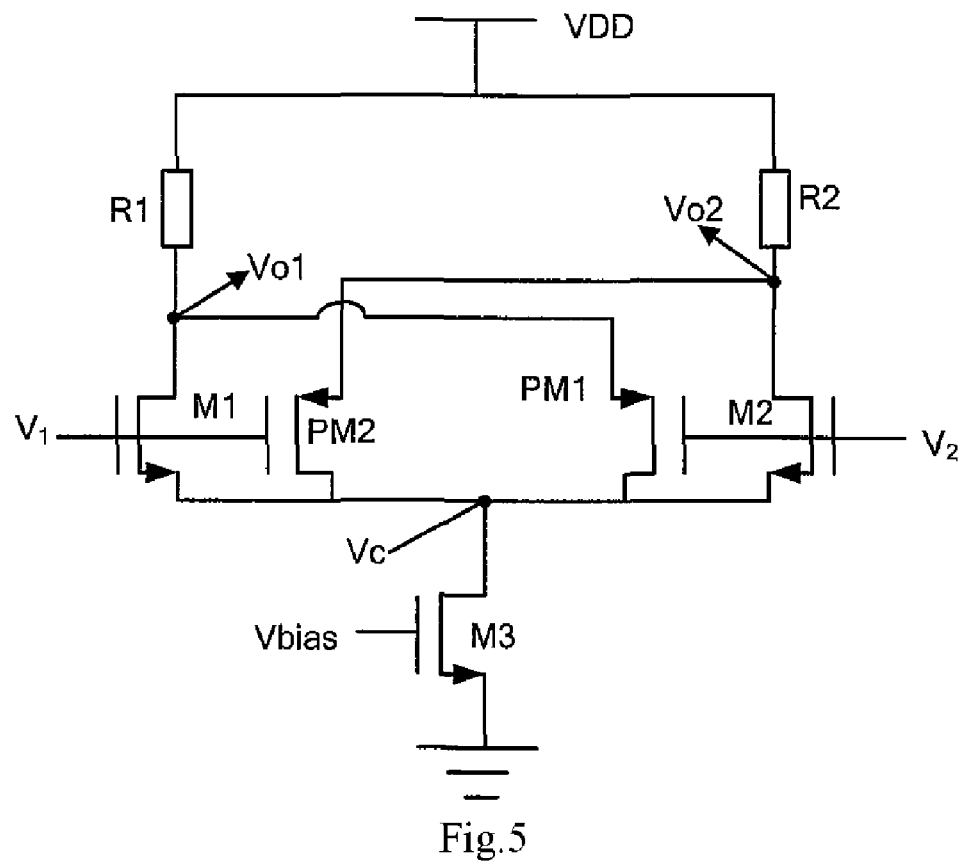
FIG. 5 is a schematic showing a low jitter converter based on FIG. 1, where the current compensation device is a PMOS transistor.

FIG. 1 and FIG. 3 show a traditional CMOS to CML converter and an improved CMOS to CML converter. It can be seen that the CMOS to CML converters are based on a differential circuit. The constitution of the differential circuit has been introduced above in detail, and will not be repeated again. FIG. 5 shows a low jitter CMOS to CML converter based on the converter shown in FIG. 1 according to the present invention. In the converter shown in FIG. 1, the differential pair transistors only include a pair of differential transistors M1 and M2. The input signals of the input terminals of the differential transistor M1 and differential transistor M2 constitute a pair of differential input signals. The two output terminals of M1 and M2 are employed as the output terminals Vo1 and Vo2 of the low jitter converter. The differential transistors are both NMOS transistors. The connection terminals of the differential transistors are sources of M1/M2, the output terminals of the differential transistors are drains of M1/M2, and the input terminals of the differential transistors are gates of M1/M2.

FIG. 5 shows a low jitter converter based on the converter shown in FIG. 1 according to the present invention. Take it as an example that the current compensation device is a PMOS transistor, the low jitter converter according to the present invention further includes current compensation transistors PM1 and PM2, the number of which is the same as the number of the differential transistors. Each current compensation transistor PM1/PM2 is connected with a differential transistor M1/M2 correspondingly. The source of the current compensation transistor PM1/PM2 is connected with the drain of the corresponding differential transistor M1/M2, where the drain is used as the output terminal. The drain of the current compensation transistor PM1/PM2 is connected with the source of the corresponding differential transistor M1/M2, where the source is used as the connection terminal. Furthermore, the current compensation transistor PM1/PM2 includes a control gate. The input signal of the gate, which is used as the input terminal, of the differential transistor M1/M2 connected with PM1/PM2 correspondingly is one of the pair of differential input signals $V_1$ and $V_2$ of the low jitter converter, i.e. V1/V2, and the other input signal $V_2/V_1$ is the input signal for the control gate of the current compensation transistor PM1/PM2. The output terminals of the two differential MOS transistors M1 and M2 are used as the two output terminals Vo1 and Vo2 of the low jitter converter.

Figure 6:
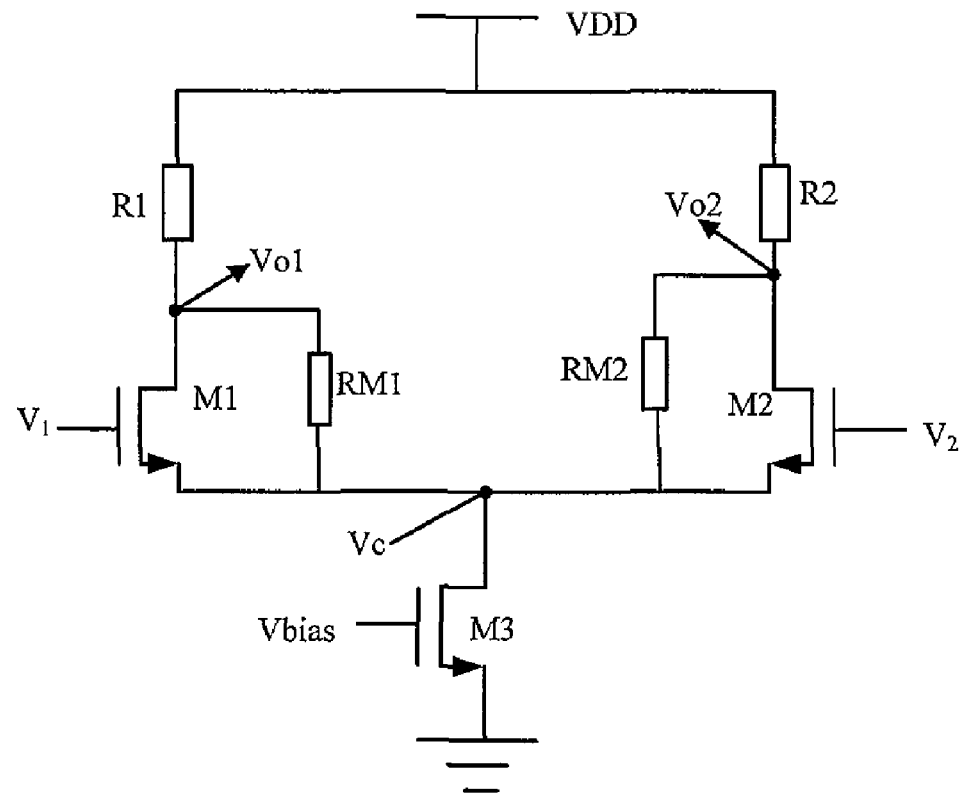
FIG. 6 is a schematic showing a low jitter converter based on FIG. 1, where the current compensation device is a resistor.

Similarly, for the current compensation device shown in FIG. 5, current compensation resistors may be employed to replace the PMOS transistors. Referring to FIG. 6, the differential pair transistors based on FIG. 1 only include a pair of differential transistors M1 and M2, and the current compensation resistor includes a pair of current compensation resistors RM1 and RM2. Each current compensation resistor RM1/RM2 is connected with a differential transistor M1/M2 correspondingly, i.e., one terminal of the current compensation resistor RM1 is connected with the drain of the differential MOS transistor M1/M2, where the drain is used as the output terminal, and the other terminal of the current compensation resistor RM1 is connected with the source of the differential MOS transistor M1/M2, where the source is used as the connection terminal.

Figure 7:
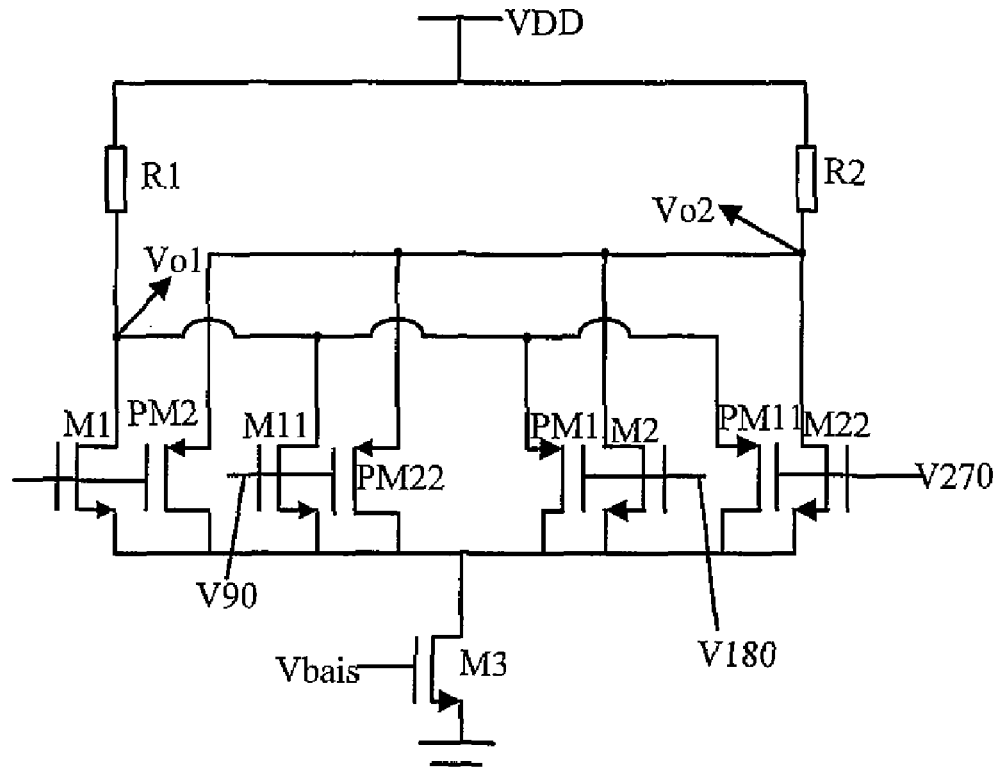
FIG. 7 is a schematic showing a low jitter converter based on FIG. 3, where the current compensation device is a PMOS transistor.

Now the improved CMOS to CML converter as shown in FIG. 3 is taken as an example. In the improved CMOS to CML converter, the differential pair transistors include two pairs of differential transistors: M1 and M2, M11 and M22. The two pairs of the differential transistors are divided into two groups, each group includes two differential transistors, where M1 and M11 are in a group, and M2 and M22 are in a group. In each group, the connection terminals of two differential transistors M1 and M11 or M2 and M22 are connected with each other, and the output terminals of the two differential transistors M1 and M11 or M2 and M22 are connected with each other. The input signal of one differential transistor M1/M11 in one group and the input signal of one differential transistor M2/M22 in the other group are differential signals with respect to each other. The four differential transistors M1, M11, M2 and M22 are all NMOS transistors. Similarly, for the four differential transistors, the input terminal of each differential transistor is the gate of the NMOS transistor, the output terminal of each differential transistor is the drain of the NMOS transistor, and the connection terminal of each differential transistor is the source of the NMOS transistor. Referring to FIG. 7, in the low jitter converter according to the present invention, it is taken as an example that the current compensation device is a PMOS transistor. Based on the four differential transistors in FIG. 2, four PMOS transistors for current compensation are employed in FIG. 7, i.e. PM1, PM11, PM2 and PM22. The source of transistor PM1 is connected with the drain of the corresponding NMOS transistor M1, and the drain of transistor PM1 is connected with the source of the corresponding NMOS transistor M1. Similarly, the source of transistor PM2 is connected with the drain of the corresponding NMOS transistor M2, and the drain of transistor PM2 is connected with the source of the corresponding NMOS transistor M2. The connection relationship between PM11 and M11 and the connection relationship between PM22 and M22 are the same as that between PM1 and M1 and that between PM 2 and M2. The PMOS transistor, which is also used for current compensation, further has a control gate. With PM1 as an example, the input signal of M1 that is connected with PM1 correspondingly is V0 of a pair of differential input signals V0 and V180, whereas the other differential input signal V180 is input to the control gate of transistor PM1. Similarly, the input signal of M2 that is connected with PM2 correspondingly is V180 of the pair of differential input signals V0 and V180, whereas the other differential input signal V0 is connected to the control gate of transistor PM2. Similarly, the input signal of M11 that is connected with PM11 correspondingly is V90 of a pair of differential input signals V90 and V270, whereas the other differential input signal V270 is connected to the control gate of transistor PM11. Similarly, the input signal of M22 that is connected with PM22 correspondingly is V270 of the pair of differential input signals V90 and V270, whereas the other differential input signal V90 is connected to the control gate of transistor PM22.

Figure 8:
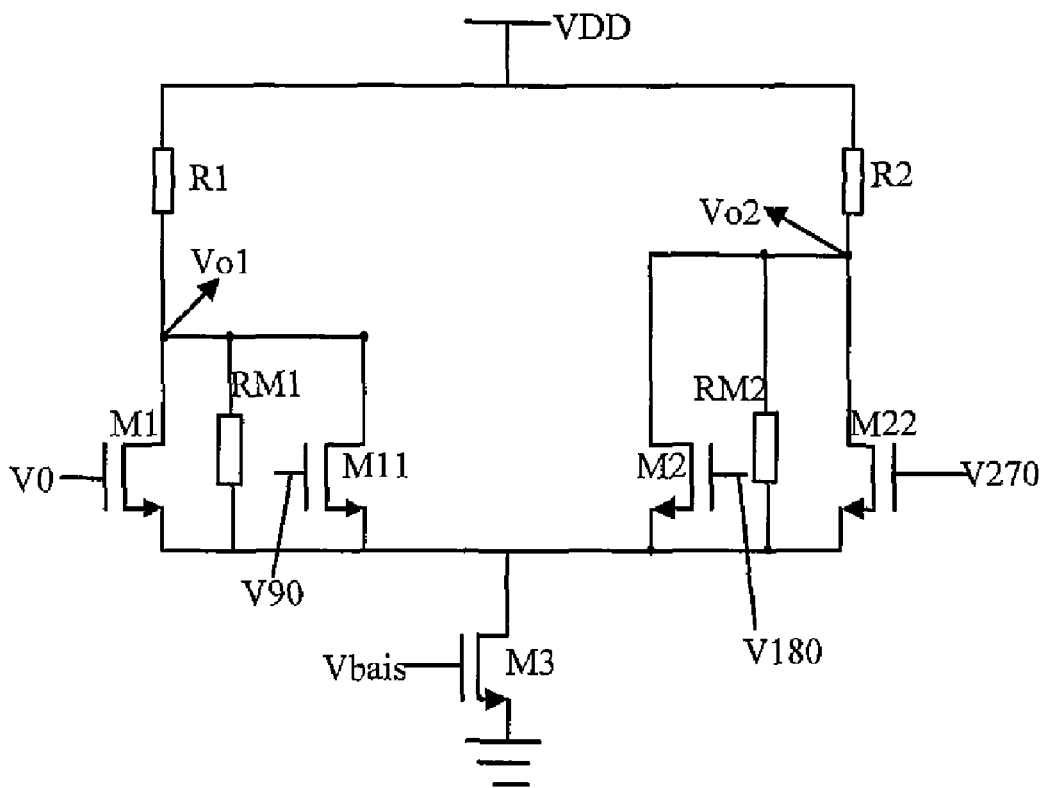
FIG. 8 is a schematic showing a low jitter converter based on FIG. 3, where the current compensation device is a resistor.

Similarly, the current compensation device, PMOS transistor, in FIG. 7 may be replaced by a current compensation resistor. Referring to FIG. 8, the converter shown in FIG. 8 includes two current compensation resistors, where one current compensation resistor is connected with a group of differential transistors correspondingly. For example, the current compensation resistors RM1 and RM2 are connected with the differential transistor group M1 and M11 and the differential transistor group M2 and M22 respectively. One terminal of the current compensation resistor RM1 is connected with the sources, which are used as connection terminals, of the differential MOS transistors M1 and M11 simultaneously, and the other terminal is connected with the drains, which are used as output terminals, of the differential MOS transistors M1 and M11 simultaneously. Similarly, one terminal of the current compensation resistor RM2 is connected with the sources, which are used as connection terminals, of the differential MOS transistors M2 and M22 simultaneously, and the other terminal is connected with the drains, which are used as output terminals, of the differential MOS transistors M2 and M22 simultaneously.

Because the operating principles of the low jitter converters according to the presenting invention shown in FIG. 5 and FIG. 7 are the same, a further description will be given with the operating principle of the converter shown in FIG. 5 as an example. If the differential input signals $V_1$ and $V_2$ are in the transition region when two differential transistors M1 and M2 are turned off simultaneously, the current compensation transistor PM1 or PM2, which is used as a biased transistor of the constant current source, provides an additional current path. For example, assuming that in the transition region, the voltage signals of $V_1$ and $V_2$ are as follows: (a) $V_1=V_2<V_c+V_{th}$, where $V_{th}$ is the threshold voltage of M1/M2, the differential transistors M1 and M2 are both turned off, and the current flowing through the current compensation transistors PM1 and PM2 are the same, i.e., equal to a half of the current $I_{M3}$ flowing through the biased transistor M3; (b) $V_2<V_1<V_c+V_{th}$, similarly, the differential transistors M1 and M2 are both turned off, the current $I_{PM2}$ flowing through PM2 is smaller than $I_{PM1}$, so that the voltage signal output from the output terminal Vo2 are greater than the voltage signal output from Vo1, and the conversion of the logic levels between the output terminals Vo2 and Vo1 is accelerated; (c) $V_2<V_c+V_{th}<V_1$, the differential transistor M1 and the corresponding current compensation device PM1 are turned on, meanwhile, PM2 is turned off and the differential transistor M2 is also turned off, thus, the output voltage signal of the output terminal Vo2 becomes the power supply voltage VDD and the current $I_{R1}$ flowing through the resistor $R_1$ is equal to the current $I_{M3}$ flowing through the biased transistor M3, so that the output terminal Vo1 has a logic low level. Thus, the current compensation transistors PM1 and PM2 not only provide the additional current path during the differential input signals transit to each other, but also act as switch transistors to accelerate the conversion of the logic levels output from the output terminals Vo1 and Vo2.

The operating principles of the converters shown in FIG. 6 and FIG. 8 are the same, and the converter shown in FIG. 6 is taken as an example. If the two input differential signals are transiting to each other and thus the differential transistors M1 and M2 are both turned off, the current compensation resistors corresponding to the differential transistors M1 and M2 provide a current bypass for the current $I_{M3}$ in the biased transistor M3 respectively, so that the object of eliminating the peak tail current of the current $I_{M3}$ in the current sink transistor M3 may also be achieved. Similarly, in FIG. 8, since two connection terminals of the two differential transistors in each group are connected with each other and the output terminals of the two differential transistors are connected with each other, one current compensation resistor may be used for the differential transistors in an individual group to provide the current bypass for the current $I_{M3}$ in the biased transistor M3. When any one of M1 and M11 is turned off, the current compensation resistor RM1 may provide the current bypass for the current $I_{M3}$ in the biased transistor M3. Similarly, when any one of M2 and M22 is turned off, the current compensation resistor RM2 may provide a current bypass for the current $I_{M3}$ in the biased transistor M3.

Figure 9:
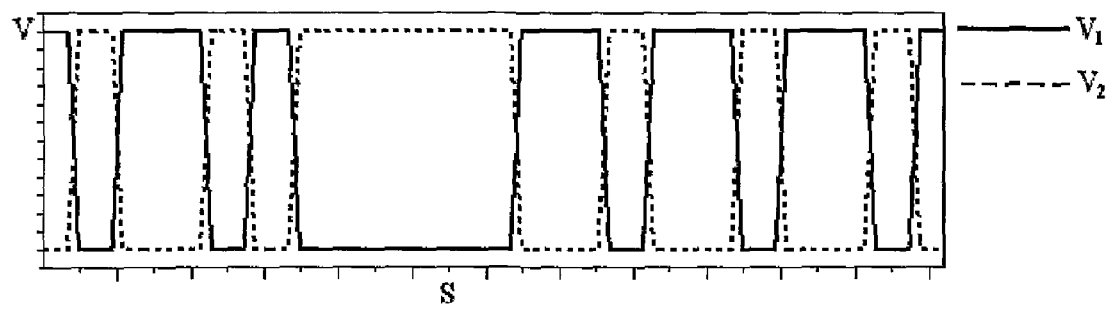
FIG. 9 are waveforms of two input signals when a simulation is performed with the converters as shown in FIG. 1 and FIG. 5.
Figure 10:
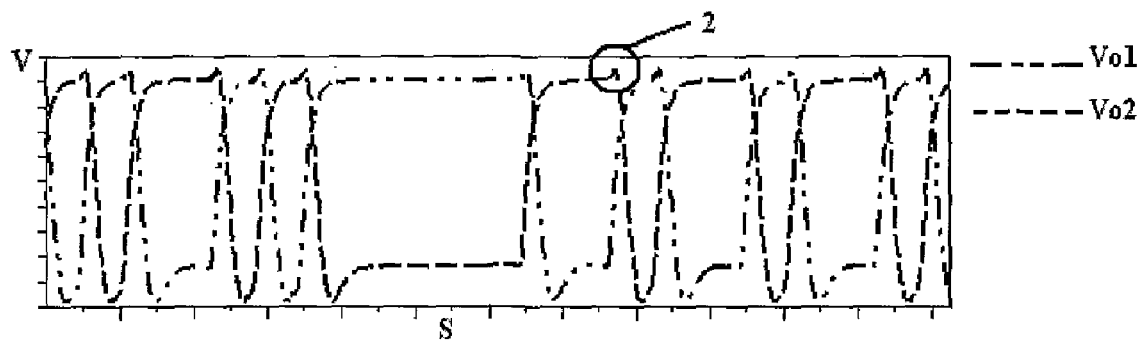
FIG. 10 is a waveform at an output terminal in the simulation of the converter as shown in FIG. 1.
Figure 11:
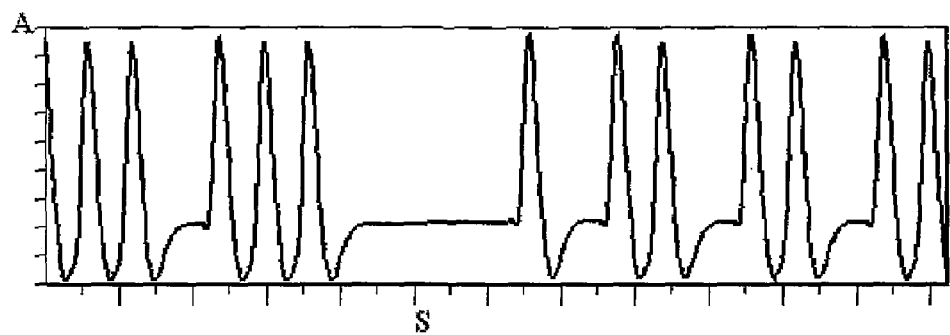
FIG. 11 is a diagram showing a peak tail current in the simulation of the converter as shown in FIG. 1.
Figure 12:
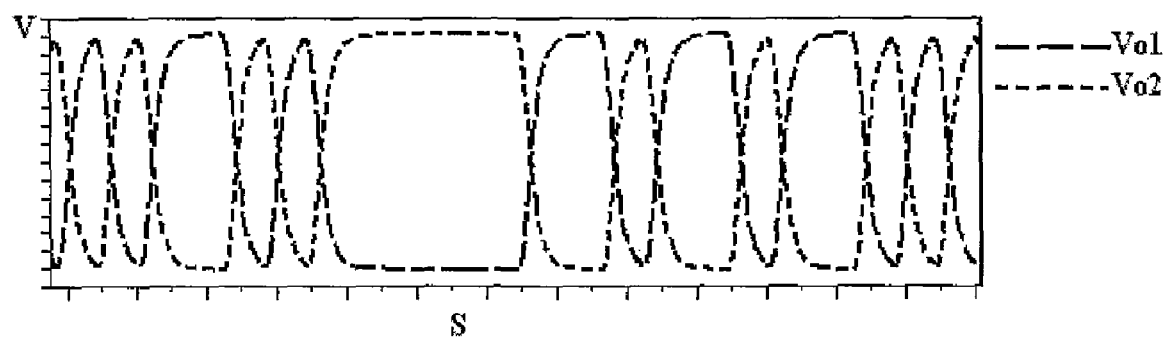
FIG. 12 is a waveform at an output terminal in the simulation of the converter as shown in FIG. 5.
Figure 13:
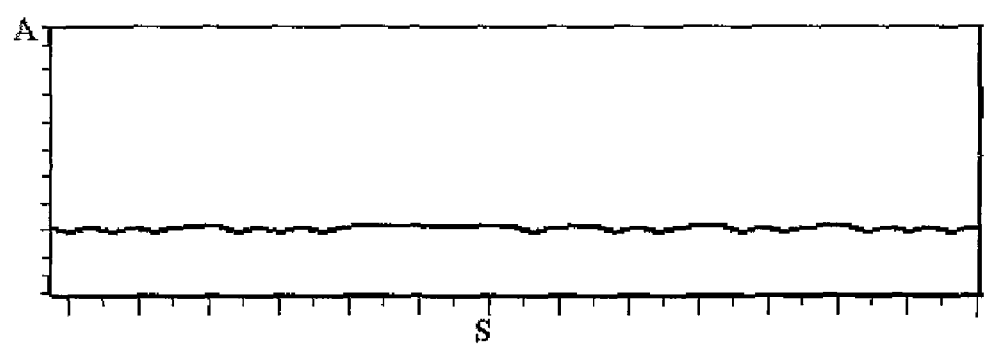
FIG. 13 is a waveform showing a peak tail current in the simulation of the converter as shown in FIG. 5.

A simulation is performed to the converters shown in FIG. 1 and FIG. 5 respectively. The two input signals of the two converters are as shown in FIG. 9. The vertical axis of FIG. 9 represents the amplitude of the input voltage signal with the unit of Voltage (V), and the horizontal axis represents the time with the unit of second (S). The solid line represents the input signal $V_1$ and the dashed line represents the input signal $V_2$. In the simulation of the converter shown in FIG. 1, the waveforms of the output signals of the output terminals Vo1 and Vo2 are as shown in FIG. 10, where the dot line represents the output waveform of the output terminal Vo1, and the dash line represents the output waveform of the output terminal Vo2. In the converter shown in FIG. 1, the peak tail current existing in the current sink transition between the signal $V_1$ and $V_2$ is as shown in FIG. 11, where the horizontal axis has the unit of second (S), and the vertical axis has the unit of Ampere (A). In the case of the input signal shown in FIG. 9, the waveform of the voltage signal of the output terminal in the simulation of the converter shown in FIG. 5 is as shown in FIG. 12, and the peak tail current is as shown in FIG. 13. Comparing FIG. 10 with FIG. 12, it can be seen that the small peak 2 of FIG. 10 does not exist in FIG. 12. Comparing the peak tail current shown in FIG. 11 with that shown in FIG. 13, it can be seen that the peak tail current in FIG. 13 is much smoother.

Figure 14:
FIG. 14 is a waveform showing a peak tail current in the simulation of the converter as shown in FIG. 6.

From the above analysis and simulation, it can be seen that, in comparison with the traditional converter, the low jitter CMOS to CML converter according to the present invention, which is described in the case that the differential pair transistors are NMOS transistors, may provide an additional current path for the biased transistor that is used as the constant current source with a PMOS transistor for current compensation when the two differential NMOS transistors are both turned off. In the case that the input signals are the same, a simulation is performed to the circuit shown in FIG. 6. The peak tail current obtained from the simulation is shown in FIG. 14. Similarly, the horizontal axis represents time S, and the vertical axis represents current A. Comparing FIG. 14 with FIG. 11, it can be seen that the object of providing an additional current path for the constant current source and reduce the peak tail current may also be achieved by employing the current compensation resistor. The object of the present invention may also be achieved by employing other similar current compensation device, such as an NMOS transistor whose threshold voltage is zero. Because the structure of the differential circuit may be different, different current compensation devices may be employed for different differential converters so as to implement current compensation for the constant current source in the converter. For example, when the differential pair transistors are PMOS transistor, the current compensation device may be an NMOS transistor or a PMOS transistor, etc. Therefore, the current compensation device in the converter according to the present invention is not limited to the PMOS transistor and current compensation resistor as recited in the embodiments. When the differential pair transistors in the converter are NMOS transistors, the PMOS transistor is preferably used as the current compensation device, because the PMOS transistor can not only provide an additional current bypass for the constant current source in the converter but also can accelerate the conversion between the logic levels of the two output terminals of the converter. In the low jitter converter according to the invention, the current compensation device is added to the differential pair transistors, so that the problem of the peak tail current, that may be caused in the constant current source M3 if the two input signals are in the transition period and the differential pair transistors are both turned off, may be effectively solved. Moreover, the problem caused by the peak tail current, i.e. the common mode output signals of the output terminals are unstable and the converter has a high jitter, may be solved.

What is claimed is:

1. A low jitter CMOS to Current-Mode Logic (CML) converter, comprising:
    a differential circuit comprising differential pair transistors, a pair of loads and a biased transistor, each differential transistor of the differential pair transistors having an input terminal, an output terminal and a connection terminal; and
    a plurality of current compensation devices, each differential transistor corresponding to a current compensation device and two terminals of the current compensation device being connected with the output terminal and the connection terminal of the differential transistor respectively.

2. The low jitter CMOS to CML converter according to claim 1, wherein:
    the differential pair transistors comprise a pair of differential transistors and input signals of the input terminals of the differential transistors are a pair of differential input signals with respect to each other.

3. The low jitter CMOS to CML converter according to claim 2, wherein:
    the pair of differential transistors comprises NMOS transistors, the input terminal of the differential transistor is a gate of the NMOS transistor, the output terminal of the differential transistor is a drain of the NMOS transistor and the connection terminal of the differential transistor is a source of the NMOS transistor.

4. The low jitter CMOS to CML converter according to claim 3, wherein:

the current compensation device comprises two PMOS transistors, wherein one PMOS transistor is connected with a differential NMOS transistor, a source of the PMOS transistor is connected with the drain of the NMOS transistor, and a drain of the PMOS transistor is connected with the source of the NMOS transistor.

5. The low jitter CMOS to CML converter according to claim 4, wherein:

the PMOS transistor comprises a control gate, one differential input signal of the pair of differential input signals is input to the gate of the NMOS transistor that is connected with the PMOS transistor correspondingly, and the other differential input signal of the pair of differential input signals is input to the control gate of the PMOS transistor.

6. The low jitter CMOS to CML converter according to claim 3, wherein:

the current compensation device comprises two current compensation resistors, one current compensation resistor is connected to a differential NMOS transistor, one terminal of the current compensation resistor is connected with a drain of the NMOS transistor, and the other terminal is connected with a source of the NMOS transistor.

7. The low jitter CMOS to CML converter according to claim 1, wherein:

the differential pair transistors comprise two pairs of differential transistors, the two pairs of differential transistors are divided into two groups, and each group comprises two differential transistors; connection terminals of the two differential transistors in each group are connected with each other, output terminals of the two differential transistors are connected with each other; an input signal of a differential transistor in a group and an input signal of a differential transistor in the other group are differential signals with respect to each other.

8. The low jitter CMOS to CML converter according to claim 7, wherein:

the two pairs of differential transistors comprise NMOS transistors, the input terminal of the differential transistor is a gate of the NMOS transistor, the output terminal of the differential transistor is a drain of the NMOS transistor, and the connection terminal of the differential transistor is a source of the NMOS transistor.

9. The low jitter CMOS to CML converter according to claim 8, wherein:

the current compensation device comprises two pairs of PMOS transistors, one PMOS transistor is connected with a differential NMOS transistor, a source of the PMOS transistor is connected with the drain of the NMOS transistor and a drain of the PMOS transistor is connected with the source of the NMOS transistor.

10. The low jitter CMOS to CML converter according to claim 9, wherein:

the PMOS transistor comprises a control gate, the input signal of the gate of the NMOS transistor corresponding to the PMOS transistor is one of the pair of the differential input signals of the low jitter converter, and the other input signal, with which the input signal of the gate of the NMOS transistor constitutes a pair of differential input signals, is connected to the control gate of the PMOS transistor.

11. The low jitter CMOS to CML converter according to claim 8, wherein:

the current compensation device comprises two current compensation resistors, one current compensation resistor is connected to a group of differential NMOS transistors, one terminal of the current compensation resistor is connected with drains of two NMOS transistors in a group, and the other terminal of the current compensation resistor is connected with sources of the two NMOS transistors in the group.

* * * * *